BAND WIDTH VARYING MEANS FOR A SWEEP FREQUENCY OSCILLATOR

Filed June 27, 1962 4 Sheets-Sheet 1

INVENTORS
ERIC WINSTON
KENETH SIMONS
BY Millman and Jacobs
ATTORNEY

July 7, 1964 E. WINSTON ETAL 3,140,454

BAND WIDTH VARYING MEANS FOR A SWEEP FREQUENCY OSCILLATOR

Filed June 27, 1962 4 Sheets-Sheet 2

INVENTORS
ERIC WINSTON
KENETH SIMONS
BY Millman and Jacobs
ATTORNEY

BAND WIDTH VARYING MEANS FOR A SWEEP FREQUENCY OSCILLATOR

Filed June 27, 1962

INVENTORS
ERIC WINSTON
KENETH SIMONS
BY Millman and Jacobs
ATTORNEY

BAND WIDTH VARYING MEANS FOR A SWEEP FREQUENCY OSCILLATOR

Filed June 27, 1962

INVENTORS
ERIC WINSTON
KENETH SIMONS
BY Millman and Jacobs
ATTORNEY

United States Patent Office 3,140,454

Patented July 7, 1964

3,140,454
BAND WIDTH VARYING MEANS FOR A SWEEP FREQUENCY OSCILLATOR

Eric Winston, Melrose Park, and Keneth A. Simons, Bryn Athyn, Pa., assignors to Jerrold Electronics Corporation, Philadelphia, Pa., a corporation of Delaware Filed June 27, 1962, Ser. No. 205,608
9 Claims. (Cl. 331—178)

This invention relates to a sweep frequency oscillator the primary object of which is to provide manual adjustability of the sweep frequency so that it can be made to vary over very wide or very narrow band widths.

Another object of the invention is to provide a sweep frequency oscillator in which the sweep frequency is adjustable from wide to narrow band widths by means of a shiftable capacitor having a plurality of spaced fixed and a plurality of spaced movable plates, the latter being reciprocable by translation into and out of the spaces between the fixed plates to vary the capacitance from a very large value at a full insert position (wide band) to a relatively small value at a predetermined removal position (narrow band).

Another object of the invention is to provide a sweep frequency oscillator with a shiftable capacitor of the character above described having a means for applying periodic reciprocation to the movable capacitor plates and a means to vary the amplitude of the current to the periodic reciprocation means and thereby vary the band width.

Another object of the invention is to provide a sweep frequency oscillator with shiftable capacitor whereby the sweep frequency can be made to vary from wide to narrow band widths in combination with a means for fine tuning the center frequency.

Another object of the invention is to provide a sweep frequency oscillator with a shiftable capacitor for use in a sweep signal generator to quantitatively analyze electronic devices and circuits whereby the operator can observe the frequency response characteristic of the unit under test over a wideband (e.g. 400 mc.) and over any desired bandwidth section of it from the entire bandwidth to a very narrow bandwidth (e.g. 10 kc.).

Another object of the invention is to provide a sweep frequency oscillator with shiftable capacitor of the character described in which the means mounting and reciprocating the movable plates assures the fact that the movable plates will always assume correct ultimate insert and removal positions corresponding to wide band and narrow band widths, respectively; that at said ultimate positions the movable plates are rigidly held in a stress-free condition; and that at all times the movable plates are guided to move with unvarying parallelism to each other and to the fixed plates both in the insert and removal positions.

These and other objects of the invention will become more apparent as the following description proceeds in conjunction with the accompanying drawing, wherein.

Specific reference is now made to the drawings wherein similar reference characters are used for corresponding elements throughout.

Figures 1, 2:
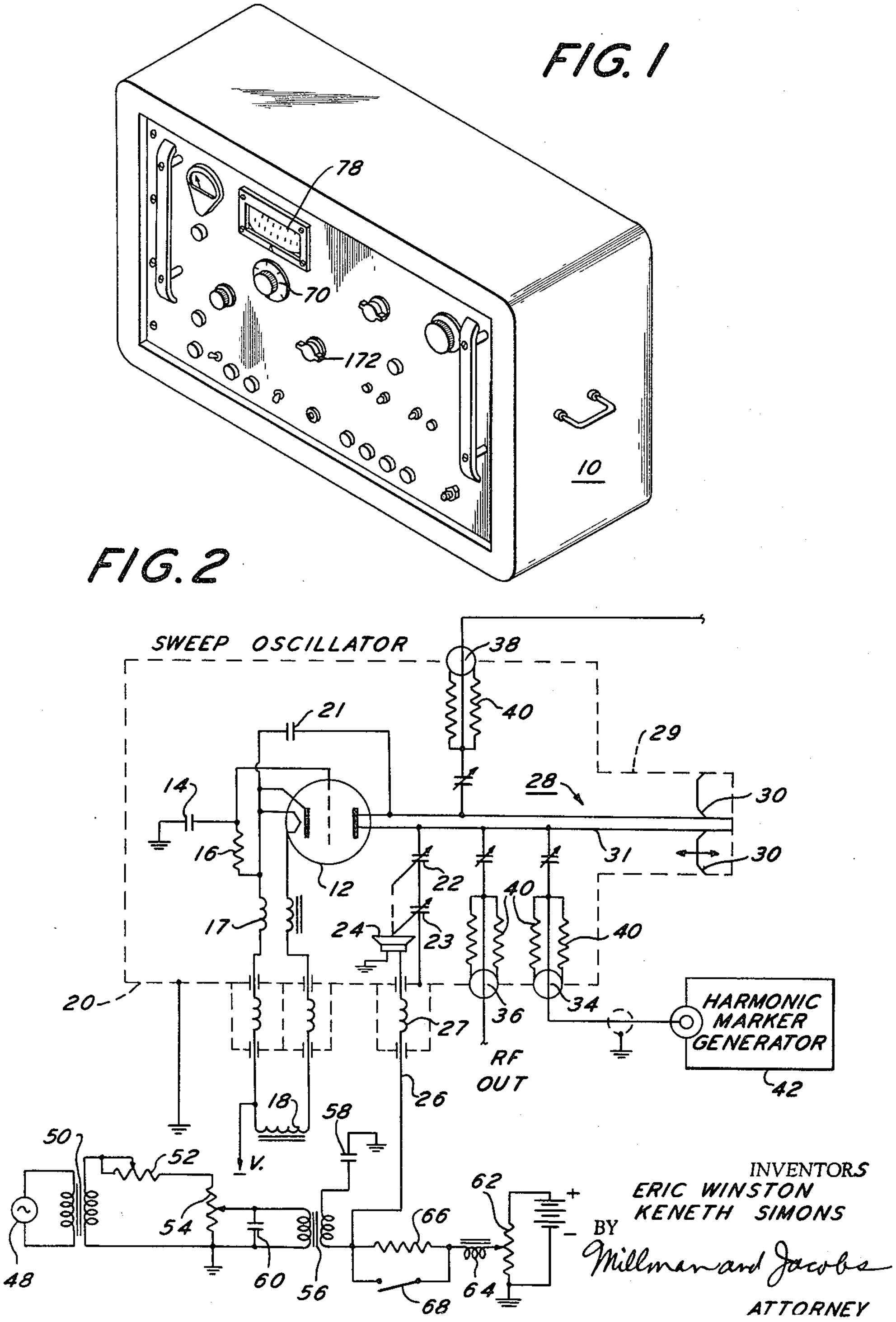
FIGURE 1 is a perspective view of a casing enclosing a sweep signal generator embodying the sweep oscillator of the instant invention.
FIGURE 2 is a circuit diagram of the sweep oscillator.

As is well known in the art, a signal generator is a test instrument which permits quantitative analysis of various electronic devices and circuits by means of sweep frequency techniques. The sweep frequencies are generated by an oscillator, a suitable form of which is shown in FIGURE 2 in which the frequency is modulated continuously over a preset range. The oscillator includes a triode 12, whose grid is connected to ground via a capacitor 14 that provides a low impedance RF (radio frequency) ground connection. The cathode is connected to the grid via a biasing resistor 16, and the filaments are heated by means of a suitable transformer 18 which is connected to the filament through a grounded shield 20 and a bifilar choke 17. The cathode return is via line 44 connected to one side of the secondary of transformer 17. Plate-to-cathode feedback is via a capacitor 21.

The frequency of the oscillator is determined by a high-Q resonant plate circuit, which includes variable series capacitors 22 and 23, which are driven by means of a wobbulator voice coil motor 24 in response to an alternating driving signal supplied through the line 26 and choke 27. The inductive element of the plate circuit is a coaxial line section 28. The coaxial line 28 includes a grounded cavity tube 29 and a low inductance shorting plunger 30, which is adjustably moved along a center rod 31 within the cavity tube 29 to vary the electrical length of the line, and, thereby, the center frequency at which the oscillator operates. The inductive line 28 is resonated with the capacitors 22, 23 which are of the variable air-dielectric type, connected across the open end of the line section 28.

As explained hereinafter, the movable plates of capacitors 22, 23 are mounted on the voice coil mechanism 24 so that their position can be varied at a power line frequency, that is 60 cycles, and, thereby, the instantaneous frequency of the oscillator is likewise varied at the line frequency. The fixed plates of the capacitors 22 and 23 are respectively connected to the tube anode and to ground while the movable plates float electrically, so that the capacitor has no moving connections to wear out and has minimum inductance. The movable plates of the capacitors 22 and 23 are either fully interleaved with the fixed plates to provide a large capacitance variation when driven and, thereby, frequency modulation over a wide range; or the capacitor plates are withdrawn to provide a relatively small capacitance change with the voice coil drive and, thereby, frequency modulation over a narrow range.

Three output probes 34, 36, 38 are provided each being terminated with built-in resistors 40 to obtain proper impedance match. These probes are capacitively coupled to the resonant plate circuit by threading the probes into the inductive line. The first probe 34 is connected to a harmonic marker generator 42, the second probe 36 is connected to provide an RF output, and the third probe 38 may be connected to an automatic level control circuit (not shown). The latter includes a detector for deriving a voltage in accordance with the oscillator output and for supplying a negative feedback voltage via line 44 to the cathode of tube 12 and thus maintain a constant output level as the oscillator sweeps over a band of frequencies.

The drive for the modulator voice coil 24 is obtained from a 60 cycle A.C. line 48, which is supplied to a power transformer 50. The line frequency at a high voltage level is taken from the secondary of the transformer 50 and applied through a series limiting resistor 52 to a high-resistance potentiometer 54 which is used as a sweep width control. The tap of the potentiometer 54 connects the latter across the primary of a step-down transformer 56, and a capacitor 60 that is connected across the primary of transformer 26 resonates that primary to reduce its current and improve the voltage waveform. The high side of the secondary of transformer 56 is connected directly to the line 26 for driving the voice coil 26, the low side of the secondary is connected via capacitor 58 to ground. A variable D.C. voltage from potentiometer 62 is applied via a choke 64 and resistor 66 to the line 26. A control switch 68 is used to shunt the resistor 66. The capacitor 58 prevents direct current flow in the transformer secondary, and the choke 64 in series with the potentiometer 62 prevents shunting of the A.C. that is applied to the voice coil.

By means of the sweep width control potentiometer 54 the amplitude of the voice coil drive is varied, and thereby the amplitude of its motion is varied over a very wide range. This also varies the width of the oscillator sweep over a wide range, which may be of the order of magnitude of a thousand to one. Operation of the potentiometer 62 provides a fine or vernier tuning control by varying the D.C. base level for the A.C. drive on the voice coil 24. That is, the center of the drive of the voice coil can be shifted slightly by means of this adjustment, and the center frequency of the sweep band is correspondingly adjusted. This vernier tuning of the center of the voice coil drive by means of a potentiometer 62 requires a greater mechanical motion of the voice coil when operated in the narrow sweep range as compared to the wide range. The switch 68 (which can be manually actuated) provides a control for this purpose; that is, switch 68 shorts resistor 66 to provide the required increase in current for fine tuning in the narrow band mode of operation.

The tuning of the oscillator to its center frequency is effected by means of dial 70 which is connected by a gear (not shown) to rack 72 that is slidable within the inductive tube 29 forming the coaxial line section. Rack 72 moves plunger 74 and the attached shorting contacts 30 axially within the tube 29. The knob 70 is also connected by means of a gear connection (not shown) to a crown gear 76 attached to the underside of a drum indicator 78 which is suitably calibrated. In this fashion, the oscillator frequency is tuned by varying the inductance in the plate circuit, as shown schematically in FIGURE 2.

As stated earlier, the capacitors 22 and 23 are variable or shiftable including fixed and movable plates. The fixed plates are in two units 80 and 82 while the movable plates constitute a single unit 84. The unit 80 comprises spaced parallel interconnected plates 86 (generally five in number) to which is affixed a collar 88 that is in turn fixed upon the end of the rod 31 in the shield 20 at the head end of the cavity 29. Thus, the plates 86 are electrically connected to the plate of the tube 12 which is carried by a ring (not shown) in the head end of the cavity. The other unit 82 comprises interconnected spaced parallel plates 90 which are separated from but in alignment with the other fixed plates 86. The unit 82 is conductively connected to and secured by suitable means to the shield 20. The unit 84 consists of a plurality of spaced parallel plates 92 which are retained in an insulating mount 94 that is secured by adhesion to the paper cone 96 on the diaphragm 98 of a voice coil driven by a voice coil or modulator motor 24. In length, the plates 92 exceed the combined lengths of plates 86 and 90 and by a means to be described hereinafter the plates 92 are movable into and out of interleaving relation with plates 86 and 90, the bottom wall of the shield 20 being cut-out as at 100 to permit such movement.

Figure 3:
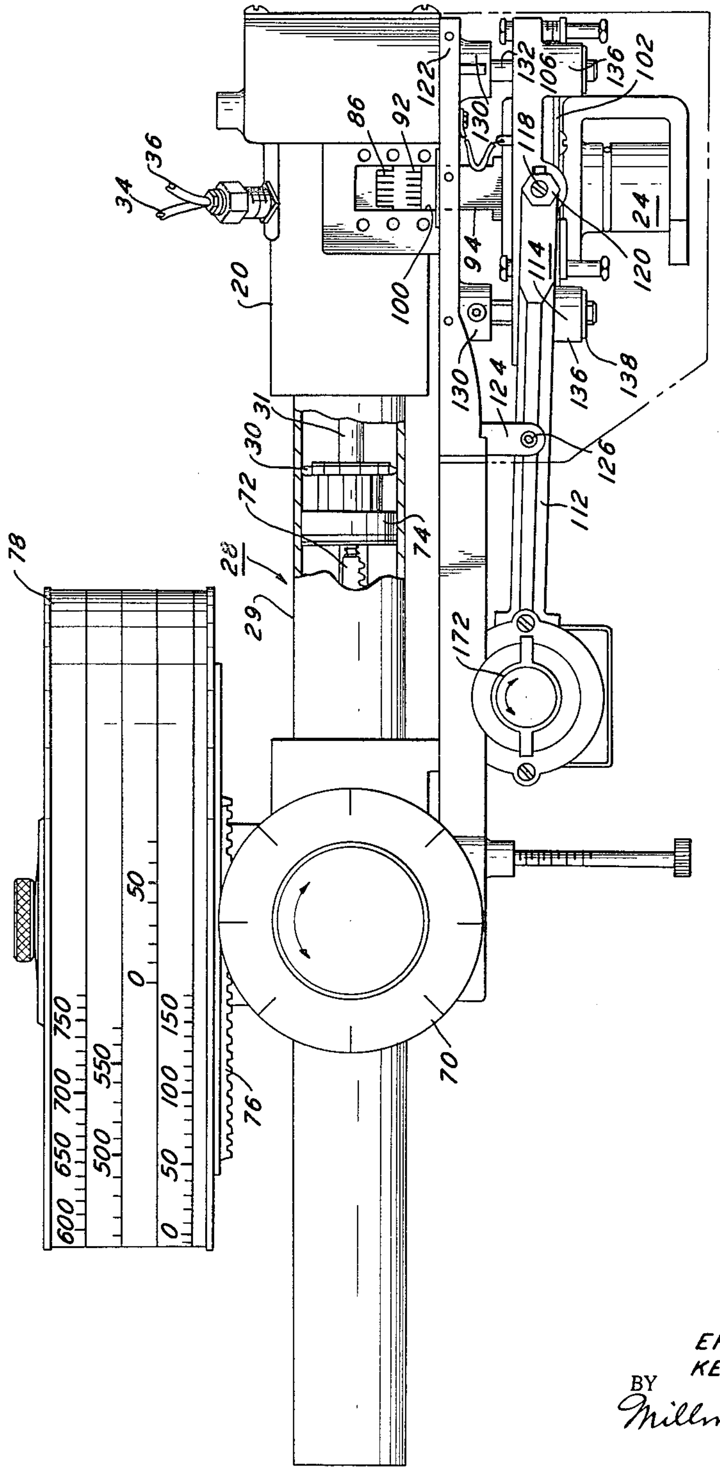
FIGURE 3 is a front elevational view of the oscillator with parts broken away to show internal detail.

The wobbulator with the capacitor plates 92 is appropriately secured upon an inner ring member 102 which is in turn secured as at 104 to an outer ring member 106, the latter being substantially circular and including arcuate recesses 108 in the periphery thereof at diametrically opposite points. A lever member 110 is provided having an arm 112 terminating in a substantially semi-circular yoke 114 the ends of which include flat faces 116 through which are threaded pivot pins 118 that extend into the recesses 108, the pins including nuts 120 to fix the adjusted positions of the pins, the periphery of the outer ring 106 beyond the recesses 108 being also flat as seen in FIGURE 3 to form flat bearing surfaces.

An elongated plate 122 is secured beneath the cavity 29 and shield 20 from which depend ears 124 carrying pivot pins 126 that extend into recesses 128 in the arm 112 of the yoke member, the position of pivot axis being chosen to secure as precise a balance for the yoke member as possible.

In order to assure smooth up and down movement of the wobbulator and capacitor plates with minimal side and endwise movement and repetitively attain accurate positioning of the movable plates 92 in the insert or interleaved position for wide band width and in the removal or non-interleaved position for narrow band width, guide means are provided. This comprises bosses 130 depending at four selected positions from the plate 122 in which are fixed vertical guide rods 132 that extend slidably and in relatively close fit through wooden bushings 134. These bushings are retained in bearings 136 provided in the outer ring 114, there being stops 138 on the lower ends of the guide rods to abut the lower ends of the bearings and thereby limit downward movement of the yoke member and thereby the capacitor plates 92 to the final removal position at the narrow band width, the abutment of the outer ring 106 against the lower faces of the bosses 130 constituting the stop position for the ultimate upward position of the yoke member and capacitor plates 92 at the final insert or wide band width position. Substantial parallelism of movement of the capacitor plates 92 relative to the fixed plates is attained because the posts 132 cause the ring 106 to pivot about an axis through the pins 118 as the yoke 114 is raised and lowered.

Figure 4:
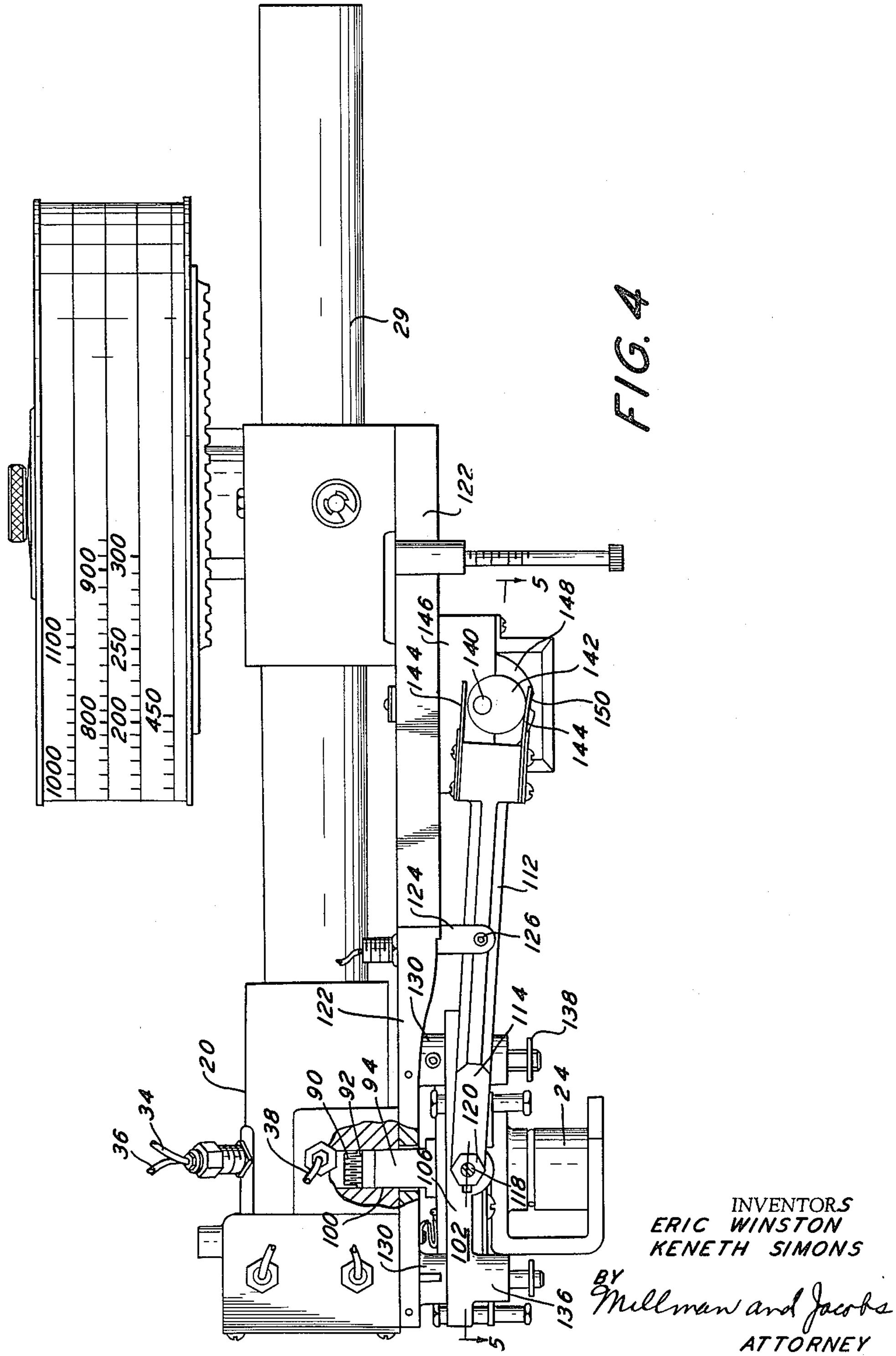
FIGURE 4 is a rear elevational view thereof.

The means to move the yoke member and hence the wobbulator and capacitor plates 92 comprises a shaft 140 carrying a cam member 142 at its inner end which is in the form of a circular disk offset from the axis of rotation of the shaft. The end of the yoke arm 112 includes spaced leaf springs 144 which bear against the periphery of the cam member 142 so that rotation of the shaft and attached cam will actuate the yoke arm to pivot around the pins 126. The bearing for the shaft is a member 146 which depends from plate 122. It is important that the movable capacitor plates 92 always and repeatedly attain the same full insert (wide band) and the same full removal (narrow band) positions otherwise the dial calibrations on drum indicator 78 will be upset. At the full insert position (furthermost counterclockwise movement of the shaft) it will be seen from FIGURE 4 that the lowermost yoke arm spring 144 bears on the cam 44 past its high point (the point on the periphery of the cam on a diameter through the axis of the shaft 140). This overriding of the high point occurs when the ring 106 bears against the bosses 130 of plate 122. Thus, this overriding urges the capacitor plates 92 to assume the proper insert position. The same occurs at the withdrawal position (furthermost clockwise movement of the shaft) when the other spring 144 of the yoke arm overrides the high point of the cam adjacent the shaft 140 thereby urging the post bearings 136 firmly against the post stops 138 in the final removal position of the capacitor plates.

The use of four posts 132 and the pivoting of the yoke member at 126 so that its center of gravity is equally spaced between the post bearings 136 insures the fact that the capacitor plates 92 will move in predetermined spaced parallelism relative to the fixed capacitor plates 86 and 90. This plus the overriding feature of the springs 144 relative to the cam 142 and shaft 140 at the final insert and removal positions of the capacitor plates 92 insures repeated and accurate attainment of these positions.

Figure 6:
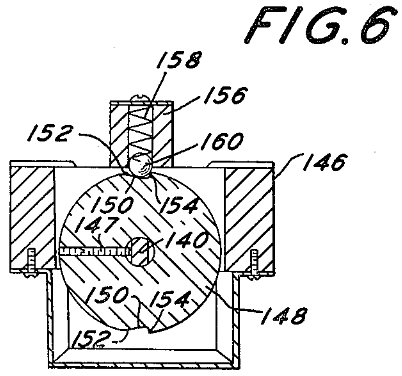
FIGURE 6 is an enlarged sectional view taken on the line 6—6 of FIGURE 5.
Figure 7:
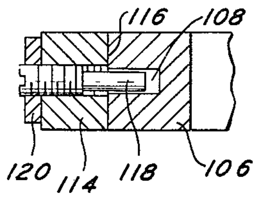
FIGURE 7 is a sectional view taken on the line 7—7 of FIGURE 5.

It is also important that at the final insert and removal positions of the capacitor plates 92, there be as little stress on the yoke and consequently on the plates as possible resulting from a tendency upon continued turning of shaft 140, to override the bosses 130 in the insert position and the post stops 138 in the removal position. For this a particular releasable detent lock construction is provided which is operative at the two positions to prevent continued turning of the shaft beyond these positions. Fixed as by set screw 147 upon the shaft is a circular disk 148 into the periphery thereof at diametrical points is milled substantially J-shaped recesses 150, as seen particularly in FIGURE 6, one end of each recess being smooth or gradual, as at 152 and the other end of the recess being sharp or abrupt, as at 154. The shaft bearing member 146 also includes a housing 156 which retains a spring which urges a ball detent 160 towards the periphery of the disk 148. When the shaft is rotated in a counterclockwise direction until the final insert position of the capacitor plates 92 is attained, at that position the ball detent 160 snaps into one of the recesses 150. Continued counterclockwise movement is prevented because the ball detent cannot override the sharp edge 154 of the recess. Hence, no matter what attempt is made to continue rotation of the shaft in this counterclockwise direction, no stresses will be transmitted to the ring 106 and the capacitor plates 92. However, the shaft can be reversely rotated in the clockwise direction whereupon the ball detent will ride over the smooth end 152 of the recess 150. Clockwise movement is continued until the ball detent enters the other recess 150 just when the capacitor plates 92 reach the final full removal position. Again, any attempt to continue the same clockwise movement will not result in stresses transmitted to the capacitor plates since the ball detent cannot override the sharp end 154 of the recess. Thus, the shaft is free to rotate first in one then in a reverse position, but cannot rotate beyond the attained final positions at the end of each rotational stroke.

As mentioned earlier, a switch 68 is provided, see FIGURE 2, which shorts resistor 66 to cause the required increase in current to the wobbulator drive for fine tuning in the narrow band mode of operation or full removal position of the capacitor plates 92. It will be understood that the turning of shaft 140 from the full insert to the full removal position will actuate the switch 68.

Figure 5:
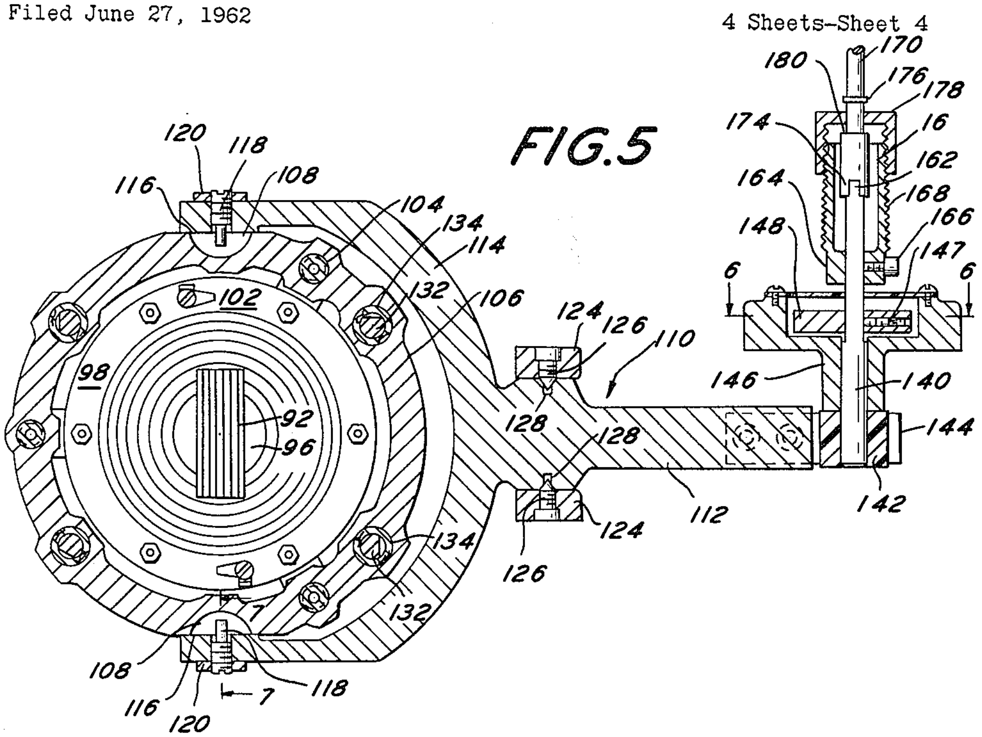
FIGURE 5 is an enlarged sectional view taken on the line 5—5 of FIGURE 4.
Figure 8:
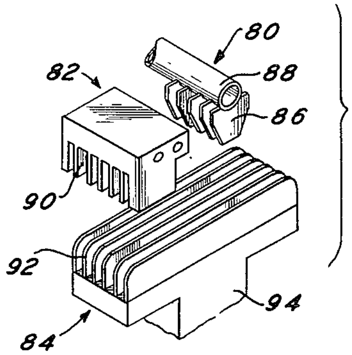
FIGURE 8 is a group perspective view of the elements of the shiftable capacitor.

To reduce vibrations, the shaft must have an extension beyond the front panel. To accomplish this, the end of the shaft 140 has a tongue 162, see FIGURE 5, which extends into a collar 164 that is secured to the shaft by a set screw 166. The inner face or bore of the collar is smooth while the outer face is threaded as at 168. The extension is a rod 170 with a knob 172 at its free end, a fork 174 at its other end, a stop 176 adjacent said end and an internally threaded collar 178 loosely mounted on the extension between the stop 175 and the shoulder 180 of the fork 174. Thus, the extension can be pushed through the panel with the fork extending into the externally threaded collar 164 until it engages the tongue 162 of shaft 140. Then, by threading the collar 178 on the collar 164, the collar 178 is made to bear against the shoulder 180 and cause firm engagement of the shaft and the extension and the two can be rotated as a unit. To remove the extension from the shaft, when desired, the operator can go through the panel opening, after removal of the knob, with a spanner wrench to unscrew the collar 178 whereupon it and the extension are removed as a unit.

It will thus be seen that a sweep frequency oscillator is provided wherein the sweep frequency is adjustable from very wide to very narrow band widths by means of a shiftable capacitor which functions repeatedly to assure accurate attainment of stress-free final insert (wide band) and removal (narrow band) positions of the movable capacitor plates in a translatory motion relative to the fixed capacitor plates. It is thought that the operation of the device will be apparent to a skilled artisan from the above description without more. It will be understood that variations may be made by skilled artisans without departing from the invention and scope of the appended claims.

We claim:

1. In a sweep frequency oscillator having a variable tuned circuit; a shiftable capacitor comprising a support, a first set of spaced parallel capacitor plates fixedly mounted on said support and electrically connected to the circuit, a second set of spaced parallel capacitor plates, means mounting said second set of plates on said support for translatory movement selectively into interleaving relation with said first set of plates to a wide band width and out of interleaving relation with said first set of plates to provide a narrow band width and means to apply periodic translatory reciprocation to said second set of plates, said means mounting said second set of plates including a lever arm pivoted to said support intermediate its ends for movement around a horizontal pivot axis, a member supporting said second set of plates on one end of said lever arm and means operative on the end of said lever arm to pivot the same around its axis, said member supporting said second set of plates includes aligned pins pivotally mounted on said one end of said lever arm whereby said member is pivoted about an axis through said pins substantially parallel to the horizontal pivot axis of said lever arm, and means to guide said member in its movement towards and away from said fixed plates.

2. The combination of claim 1 wherein said guide means includes posts carried by said support around said fixed plates and bearings on said member slidably receiving said posts.

3. The combination of claim 1 wherein said member includes a ring whose pivot pins are diametrically aligned and said means to apply periodic translatory reciprocation to said second set of plates includes a voice coil motor supporting said second set of plates and mounted on said ring.

4. The combination of claim 1 wherein said means operative on the other end of said lever arm to pivot the same about its axis includes a rotatable shaft and a circular cam carried thereby offset from the axis of rotation of said shaft and means at said other end of said lever arm contacting said cam.

5. The combination of claim 4 and stops limiting movement of said one end of said lever arm at the full interleaving and full withdrawal positions of said second set of plates, said means at said other end of said lever arm contacting said cam including springs contacting said cam at diametrically opposed points, said springs acting on said cam beyond its high point when said lever arm engages said stops to urge said lever arm firmly against said stops.

6. The combination of claim 1 wherein said means operative on the other end of said lever arm to pivot the same about its axis includes a rotatable shaft, means causing interengagement of said shaft and said other end of said lever arm whereby rotation of said shaft in one direction will raise said one end of said lever arm while rotation in a reverse direction will lower the same and releasable means to selectively stop rotation of said shaft in said one and said reverse directions when said one end of said lever arm reaches predetermined upper and lower limits.

7. The combination of claim 6 wherein said releasable means to selectively stop rotation of said shaft includes a circular disk rotatable therewith, diametrically opposed recesses in said disk and a spring-urged detent engaging said disk and adapted to enter said recesses, each recess being of such shape as to provide a gradual edge and an opposed sharp edge whereby when said shaft is rotated in a given direction, the said detent will enter one of said recesses over said gradual edge, enter one of said recesses and engage said sharp edge thereof so that continued rotation of said shaft in the same given direction will be prevented whereas rotation in the reverse direction will not until said detent is received in the other of said recesses.

8. The combination of claim 6 and stops selectively limiting upward or full interleaving position and downward or full removal position of said second set of plates, said releasable means to selectively stop rotation of said shaft being operative at said limiting stop positions of said second set of plates.

9. The combination of claim 8 wherein said releasable means to selectively stop rotation of said shaft includes a circular disk rotatable therewith, diametrically opposed recesses in said disk and a spring-urged detent engaging said disk and adapted to enter said recesses, each recess being of such shape as to provide a gradual edge and an opposed sharp edge whereby when said shaft is rotated in a given direction, said detent will enter one of said recesses over said gradual edge, enter one of said recesses and engage said sharp edge thereof so that continued rotation of said shaft in the same given direction will be prevented whereas rotation in the reverse direction will not until said detent is received in the other of said recesses.

References Cited in the file of this patent

UNITED STATES PATENTS

| | | |
|---|---|---|
| 2,261,879 | Higgins | Nov. 4, 1941 |
| 2,315,330 | Horowitz et al. | Mar. 30, 1943 |
| 2,752,499 | Hanthorn | June 26, 1956 |
| 2,788,447 | Johnson | Apr. 9, 1957 |